United States Patent
Woolsey et al.

(10) Patent No.: US 7,042,737 B1
(45) Date of Patent: May 9, 2006

(54) SYSTEM FOR EFFICIENTLY CHANNELING HIGH FREQUENCY DATA SIGNALS THROUGH SHEET METAL CONTAINMENT

(75) Inventors: Terrill L. Woolsey, Wichita, KS (US); Norman W. Hobson, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 1104 days.

(21) Appl. No.: 09/734,998

(22) Filed: Dec. 12, 2000

(51) Int. Cl.
*H05K 9/00* (2006.01)

(52) U.S. Cl. .................. 361/799; 361/800; 361/816; 361/818; 361/753; 174/35 R; 174/35 GC; 439/607

(58) Field of Classification Search ............ 361/796, 361/799, 800, 816, 818, 752, 729, 730, 788, 361/753; 174/35 R, 35 GC, 35 MS, 32; 439/607, 76.1
See application file for complete search history.

(56) References Cited

U.S. PATENT DOCUMENTS

| | | | | |
|---|---|---|---|---|
| 4,550,960 A | * | 11/1985 | Asick et al. | 439/61 |
| 4,889,959 A | * | 12/1989 | Taylor et al. | 174/35 GC |
| 5,023,754 A | * | 6/1991 | Aug et al. | 361/800 |
| 5,031,075 A | * | 7/1991 | Casanova et al. | 361/802 |
| 5,033,754 A | * | 7/1991 | Finch | 273/299 |
| 5,348,482 A | * | 9/1994 | Rudy et al. | 439/61 |
| 5,534,662 A | * | 7/1996 | Peacock et al. | 174/35 GC |
| 5,929,377 A | * | 7/1999 | Hamilton et al. | 174/35 R |
| 5,975,953 A | * | 11/1999 | Peterson | 439/607 |
| 6,080,930 A | * | 6/2000 | Lommen et al. | 174/35 GC |
| 6,195,266 B1 | * | 2/2001 | Padgett et al. | 361/799 |
| 6,284,970 B1 | * | 9/2001 | Buskmiller et al. | 174/35 GC |
| 6,325,636 B1 | * | 12/2001 | Hipp et al. | 439/61 |
| 6,403,879 B1 | * | 6/2002 | Clements et al. | 174/35 GC |
| 6,411,506 B1 | * | 6/2002 | Hipp et al. | 361/686 |
| 6,483,023 B1 | * | 11/2002 | Jacques | 174/35 GC |
| 6,483,024 B1 | * | 11/2002 | Smithson et al. | 174/35 GC |
| 6,538,903 B1 | * | 3/2003 | Radu et al. | 361/818 |
| 6,542,384 B1 | * | 4/2003 | Radu et al. | 361/818 |
| 6,552,915 B1 | * | 4/2003 | Takahashi et al. | 361/796 |
| 6,643,141 B1 | * | 11/2003 | Kaetsu et al. | 361/797 |
| 6,747,878 B1 | * | 6/2004 | Hipp et al. | 361/801 |

* cited by examiner

*Primary Examiner*—Kamand Cuneo
*Assistant Examiner*—Dameon E. Levi
(74) *Attorney, Agent, or Firm*—Suiter West Swantz PC LLO (57) ABSTRACT

A system is provided for channeling high frequency signals through sheet metal containment within an electronic device. In exemplary embodiments of the invention, an electronic device employing the system includes a midplane circuit board. One or more interface modules may be coupled to the midplane circuit board, for example, for providing a high frequency interconnect with other devices such as Fiber Channel or the like. A midplane chassis shield is disposed within the device's housing adjacent to the midplane circuit board so that the interface modules interconnect with the midplane circuit board through apertures formed in the shield wherein the midplane circuit board, midplane chassis shield and interface module cooperate for providing a low impedance tunnel for channeling high frequency signals to ground.

8 Claims, 12 Drawing Sheets

SYSTEM FOR EFFICIENTLY CHANNELING HIGH FREQUENCY DATA SIGNALS THROUGH SHEET METAL CONTAINMENT

FIELD OF THE INVENTION

The present invention generally relates to the field of devices employing high frequency data signals such as Fibre Channel, and the like, and more particularly to a system for efficiently channeling high frequency data signals through sheet metal containment within such an electronic device.

BACKGROUND OF THE INVENTION

The information explosion and the need for high-performance communications for server-to-storage and server-to-server networking have been the focus of much recent attention. Performance improvements in storage, processors, and workstations, along with the move to distributed architectures such as client/server, have spawned increasingly data-intensive and high-speed networking applications. The interconnect between these systems and their input/output devices demands a new level of performance in reliability, speed, and distance. Fibre Channel, a highly-reliable, gigabit interconnect technology allows concurrent communications among workstations, mainframes, servers, data storage systems, and other peripherals using SCSI and IP protocols. Fibre Channel provides interconnect systems for multiple topologies that can scale to a total system bandwidth on the order of a terabit per second.

Because Fibre Channel and like interconnect technologies produce high frequency short wavelength energy, devices using Fibre Channel interconnects must be shielded to prevent radio frequency interference (RFI) and provide electromagnetic compatibility (EMC). Presently, such devices are shielded using components such as shielding gaskets, conductive foam, Beryllium Copper (BeCu) springs, and the like to prevent high frequency energy from escaping the device's housing. However, prior shielding methods often allow energy to escape from the interconnects into the electronic device's housing where it could interfere with the operation of other electronic components. Consequently, it is desirable to provide a system for efficiently channeling high frequency signals through sheet metal containment within such an electronic device.

SUMMARY OF THE INVENTION

Accordingly, the present invention is directed to a system for channeling high frequency signals through sheet metal containment within an electronic device. In exemplary embodiments of the invention, an electronic device employing the system includes a midplane circuit board. One or more interface modules may be coupled to the midplane circuit board, for example, for providing a high frequency interconnect with other devices using an interconnect technology such as Fibre Channel or the like. A midplane chassis shield is disposed within the device's housing adjacent to the midplane circuit board so that the interface modules interconnect with the midplane circuit board through apertures formed in the shield wherein the midplane circuit board, midplane chassis shield and interface module cooperate for providing a low impedance tunnel for channeling high frequency signals to ground.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

Referring generally now to FIGS. 1 through 12, a system for efficiently channeling high frequency signals through sheet metal containment within an electronic device in accordance with an exemplary embodiment of the present invention is described. As shown, an electronic device 100 employing the system includes housing or chassis 102 housing a midplane circuit board 104. The midplane circuit board 104 divides the chassis 102 of the electronic device 100 into at least two regions including a first region suitable for housing the electronic device's internal electronic components and a second region suitable for receiving one or more interface modules 106 for providing a high frequency interconnect such as Fibre Channel, or the like, between the device 100 and other devices (not shown). As shown, interface modules 106 may be coupled to the midplane circuit board 104 which provides interconnection of the interface modules 106 with other electronic components within the electronic device 100.

A midplane chassis shield 108 is disposed within the device's housing adjacent to the midplane circuit board 104. The midplane chassis shield 108 may include one or more generally rectangular apertures 110 formed therein through which interface modules 106 inserted in the chassis 102 of electronic device 100 may extend to interconnect with the midplane circuit board 104. Preferably, the midplane chassis shield 108 is positioned substantially parallel to the midplane circuit board 104 and has a height and width sufficient for effectively separating the midplane circuit board 104 from the interface modules 106. The midplane chassis shield 108 may include one or more flanges or like securing mechanisms for attachment to the chassis 102 of the electronic device 100. In this manner, the midplane chassis shield 108 may function to protect the midplane circuit board 104 from environments external to the electronic device 100 when one or more interface modules 106 are removed. In exemplary embodiments of the invention, the midplane chassis shield 108 may be formed of one or more sheets of a suitably conductive material such as steel, aluminum, a conductive composite material, or the like.

Interface modules 106 each include at least one interface circuit board 112 for providing a high frequency interconnect such as Fibre Channel, or the like, with another device (not shown). In each interface module 106, the interface circuit board 112 is substantially contained within an interface module container or crew 114. As shown, each interface module container 114 is comprised of an enclosure formed of one or more sheets of a suitable conductive material such as steel, aluminum, a conductive composite material, or the like. This enclosure includes a first end suitable for interconnection with the midplane circuit board 104 and midplane chassis shield 108 and a second end supporting one or more external ports 116. External ports 116 are preferably coupled to the interface circuit board 112 of each module 106 to provide for attachment of cables and the like (not shown) for interconnecting the interface circuit board 112 of interface modules 106 with external devices. In exemplary embodiments, ports 116 may comprise a connector suitable for use with the interconnect standard being utilized by the electronic device 100. For example, wherein the electronic device 100 employs Fibre Channel technology, the device may utilize either Copper Fibre Channel or Optical Fibre channel. Copper Fibre Channel utilizes copper wire as a conductor allowing the signal to exit the port on copper cable. Optical Fibre Channel utilizes fibre optic cable as the carrier of the high frequency Fibre Channel signals. Connectors used by ports 116 include DB connectors (e.g., DB9 ports are shown), GBIC (Giga-Bit Interface Converter) connectors (e.g., 1 GHz optical ports are shown), SFP (Small Form-factor Plugable) connectors (e.g., 2 GHz SFP ports are shown), or the like. GBIC and SFP modules include translators or converters for changing the port to copper or optical Fibre Channel for the external cable connection.

Referring now specifically to FIGS. 7, 8, 10 and 11, interface modules 106 are coupled to the midplane circuit board 104 via an interface connector 118. Interface connector 118 is comprised of a first connector half 120 coupled to the interface circuit board 112 of interface module 106 that is suitable for being mated with a second connector half 122 coupled to the midplane circuit board 104. In exemplary embodiments, first and second connector halves 120 & 122 of interface connector 118 may each comprise a plurality of pins and/or pin receptacles positioned to mate with pin receptacles and/or pins of the opposite connector half 120 & 122. Preferably, interface connector 118 may include one or more logic pins 124 and at least one ground shield pin 126 for providing a ground to the interface circuit board 112. In the embodiment shown in FIGS. 7, 8, 10 and 11, each interface connector 118 includes at least two ground shield pins 126.

Figure 1:
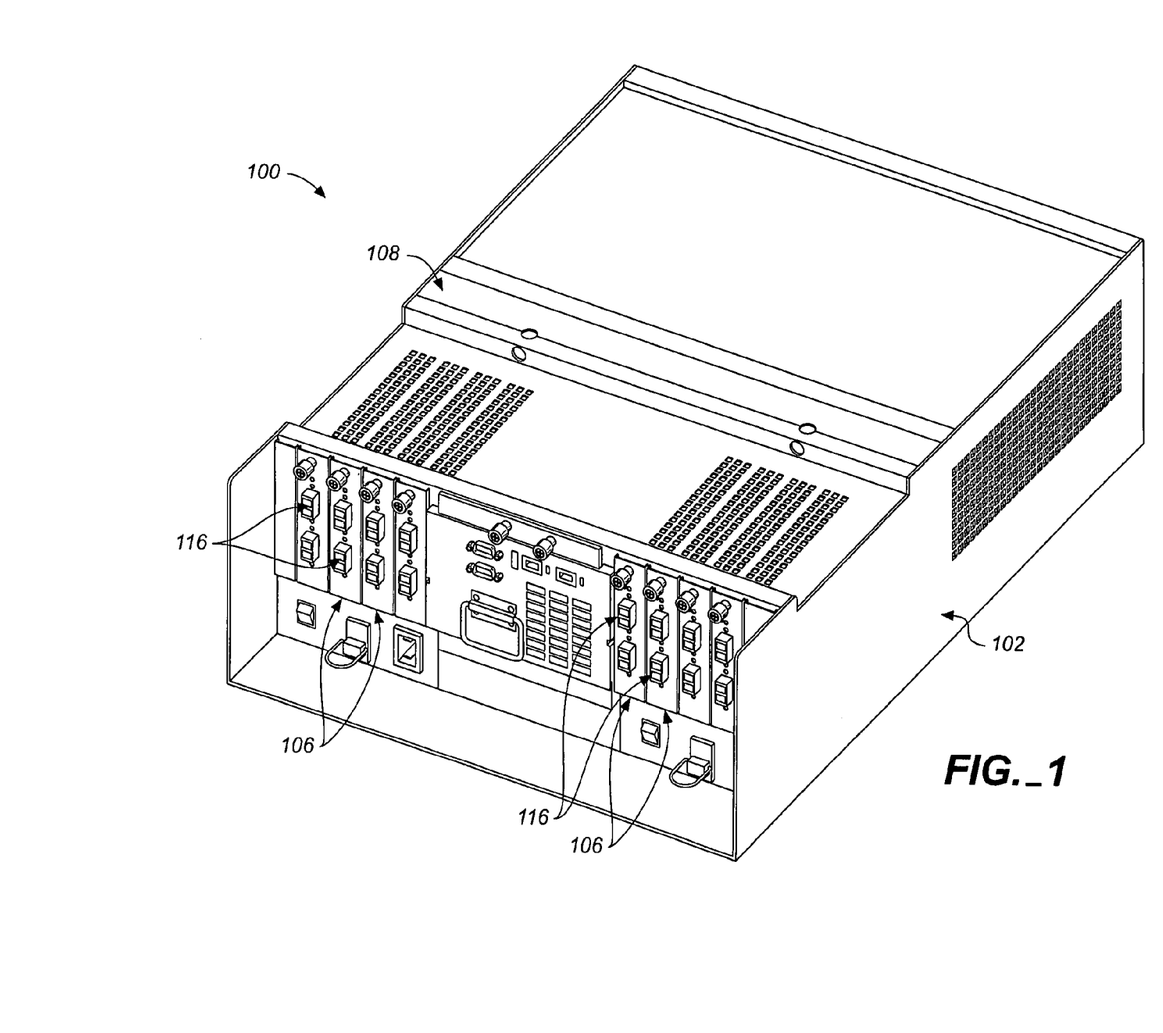
FIGS. 1 and 2 are isometric views illustrating an electronic device utilizing a system for channeling high frequency signals through sheet metal containment in accordance with an exemplary embodiment of the present invention.
Figure 2:
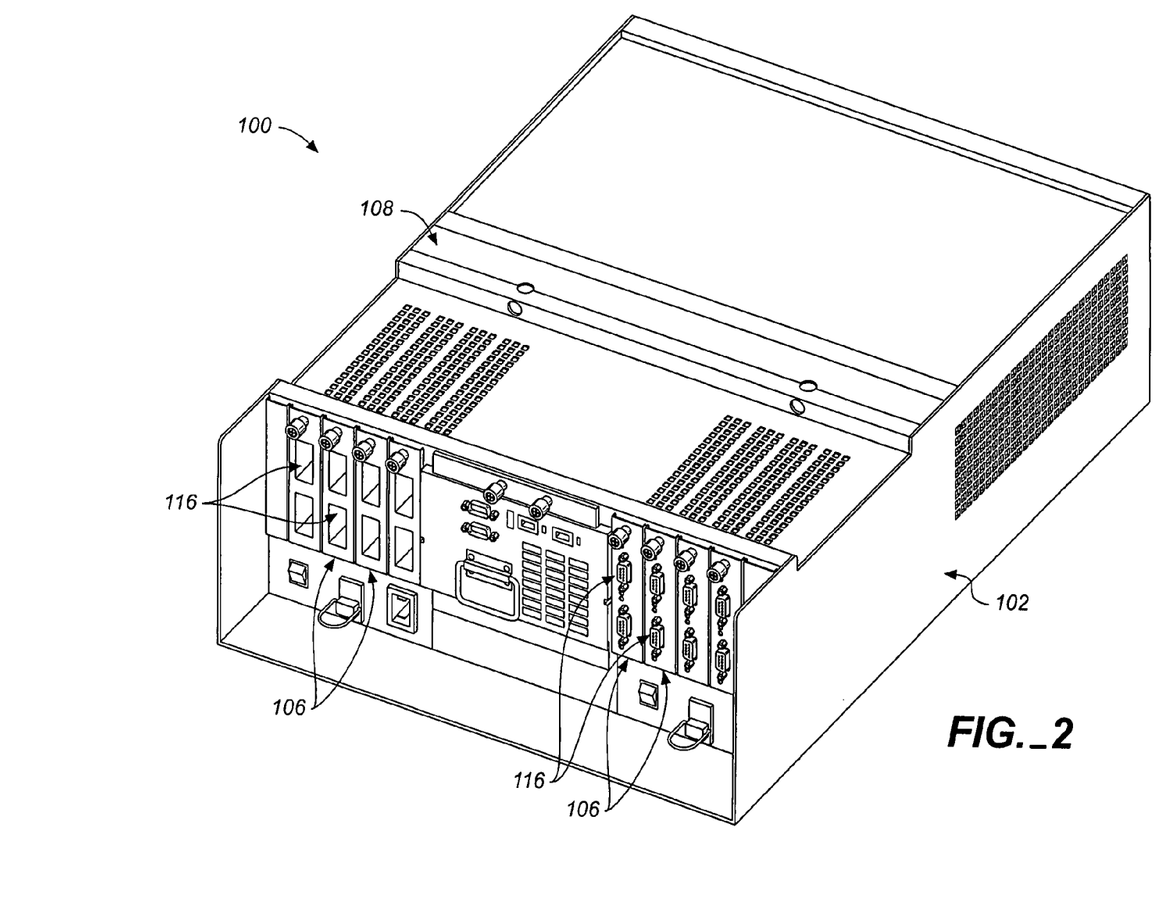
Figure 3:
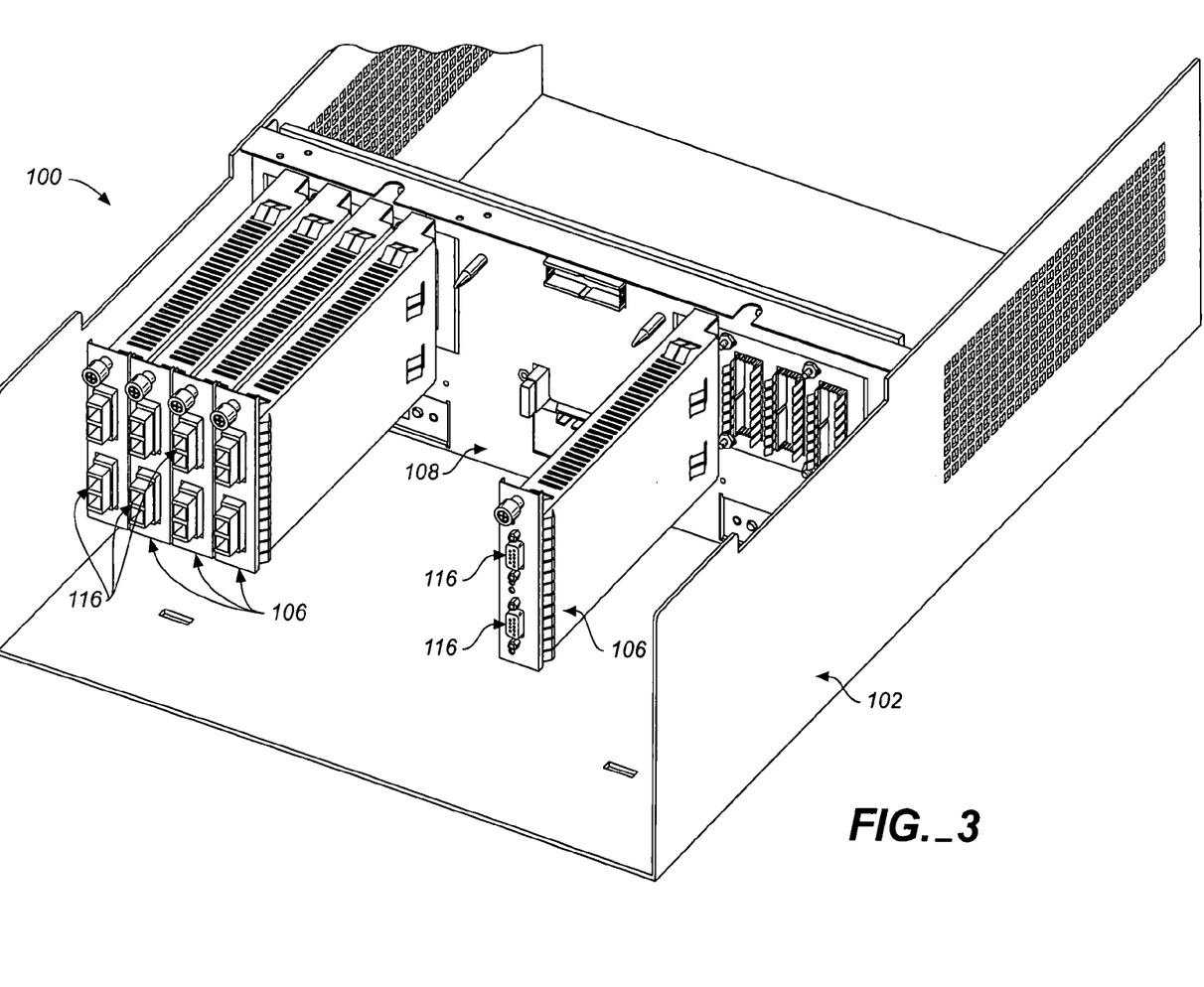
FIG. 3 is an isometric view illustrating the chassis of the electronic device shown in FIGS. 1 and 2.
Figure 4:
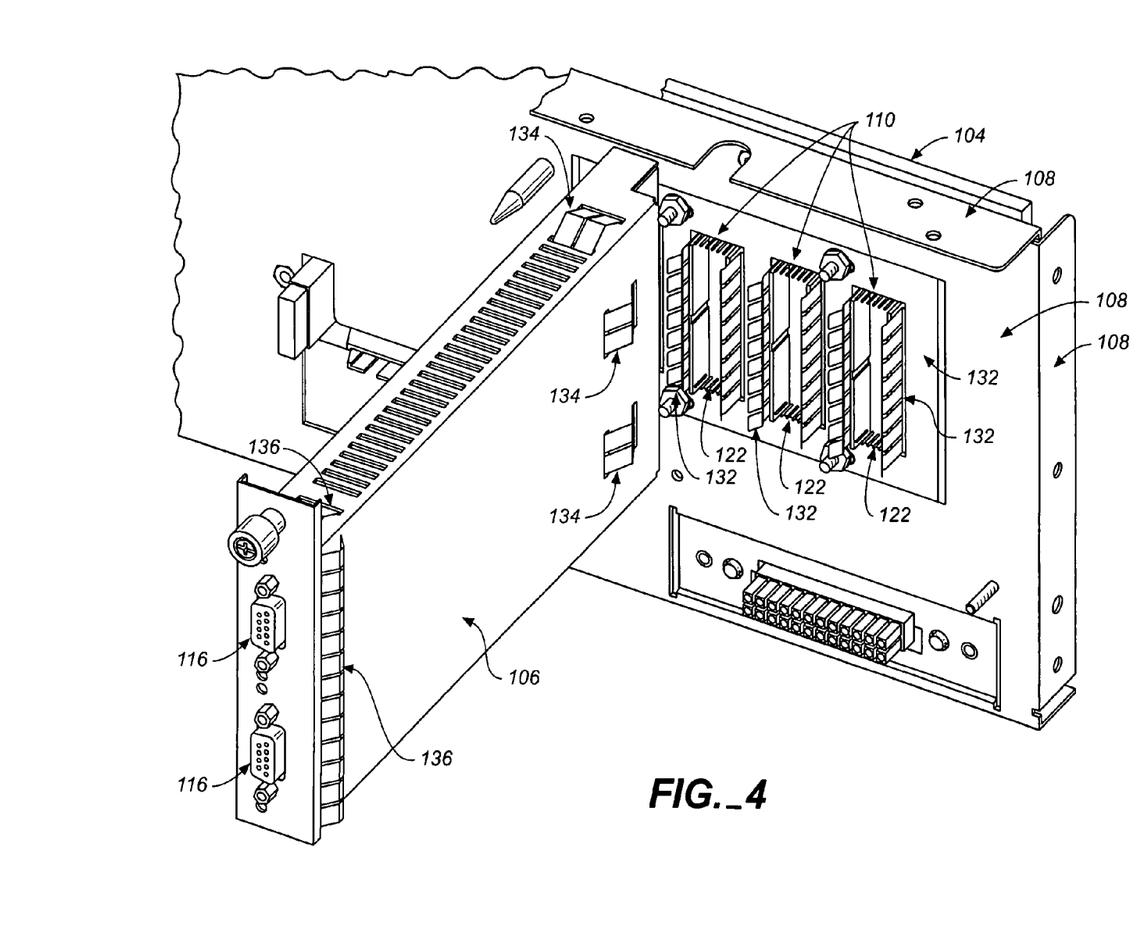
FIG. 4 is a partial isometric view illustrating the system for efficiently channeling high frequency signals through sheet metal containment electronic device in accordance with an exemplary embodiment of the present invention.
Figure 5:
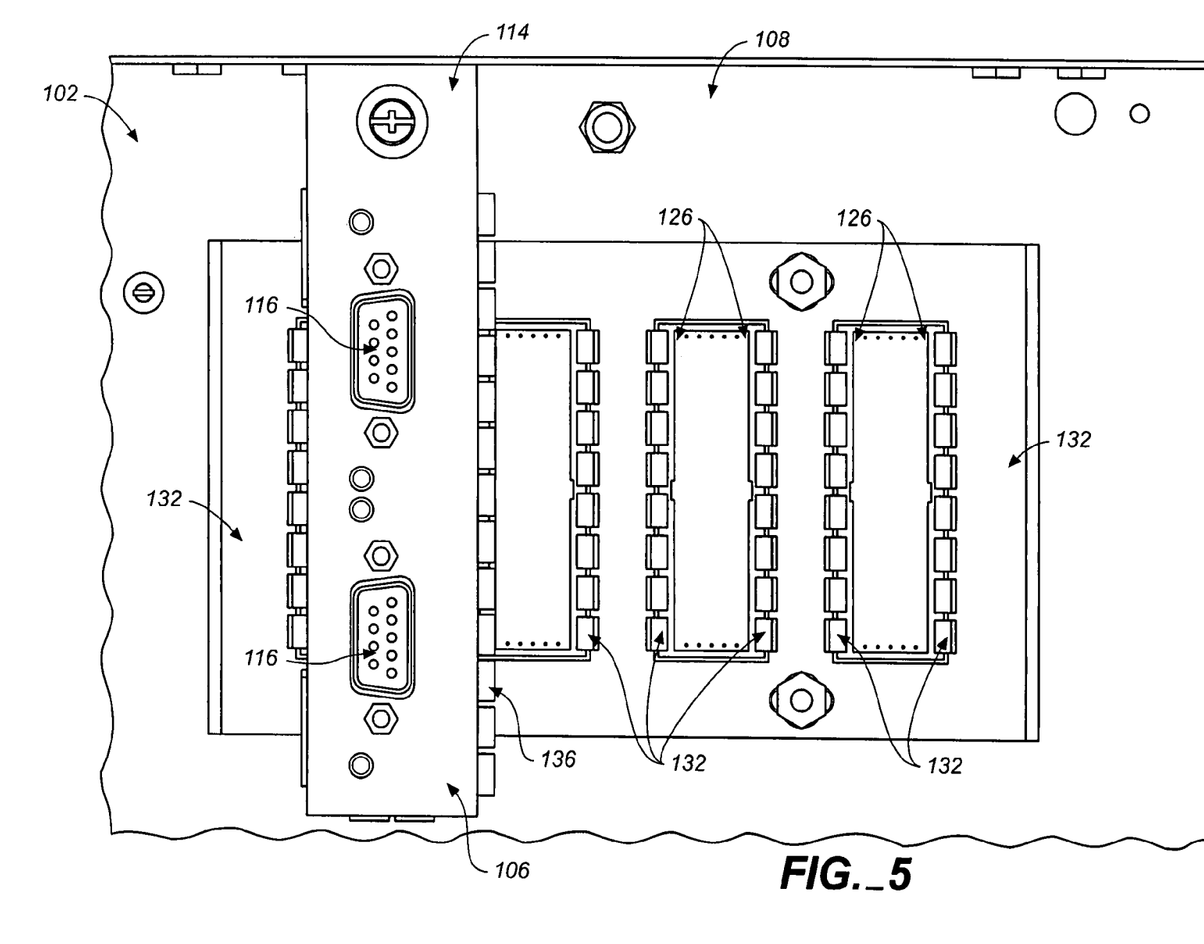
FIG. 5 is a partial end elevational view of the system shown in FIG. 4.
Figure 6:
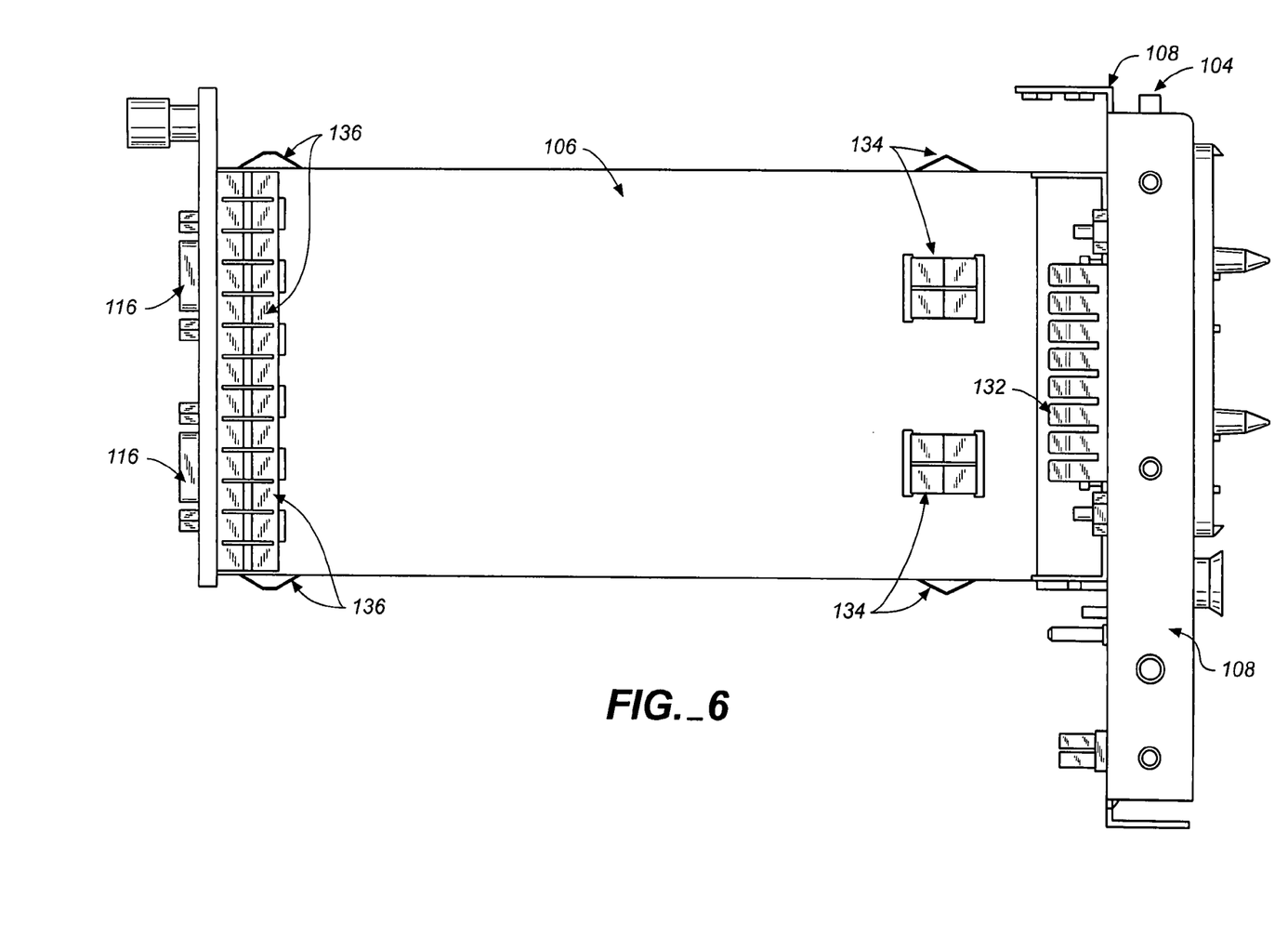
FIG. 6 is a partial side elevational view of the system shown in FIG. 4.
Figure 7:
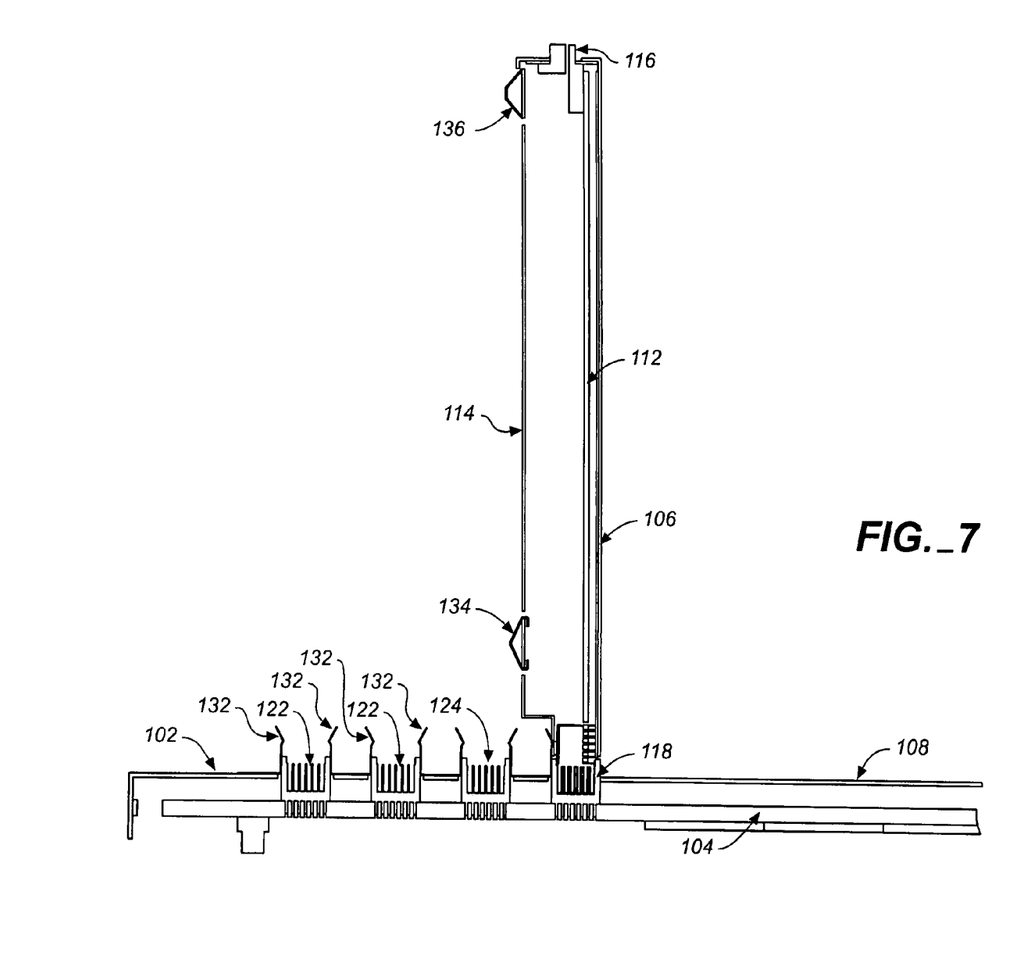
FIG. 7 is a partial top plan view of the system shown in FIG. 4.
Figure 8:
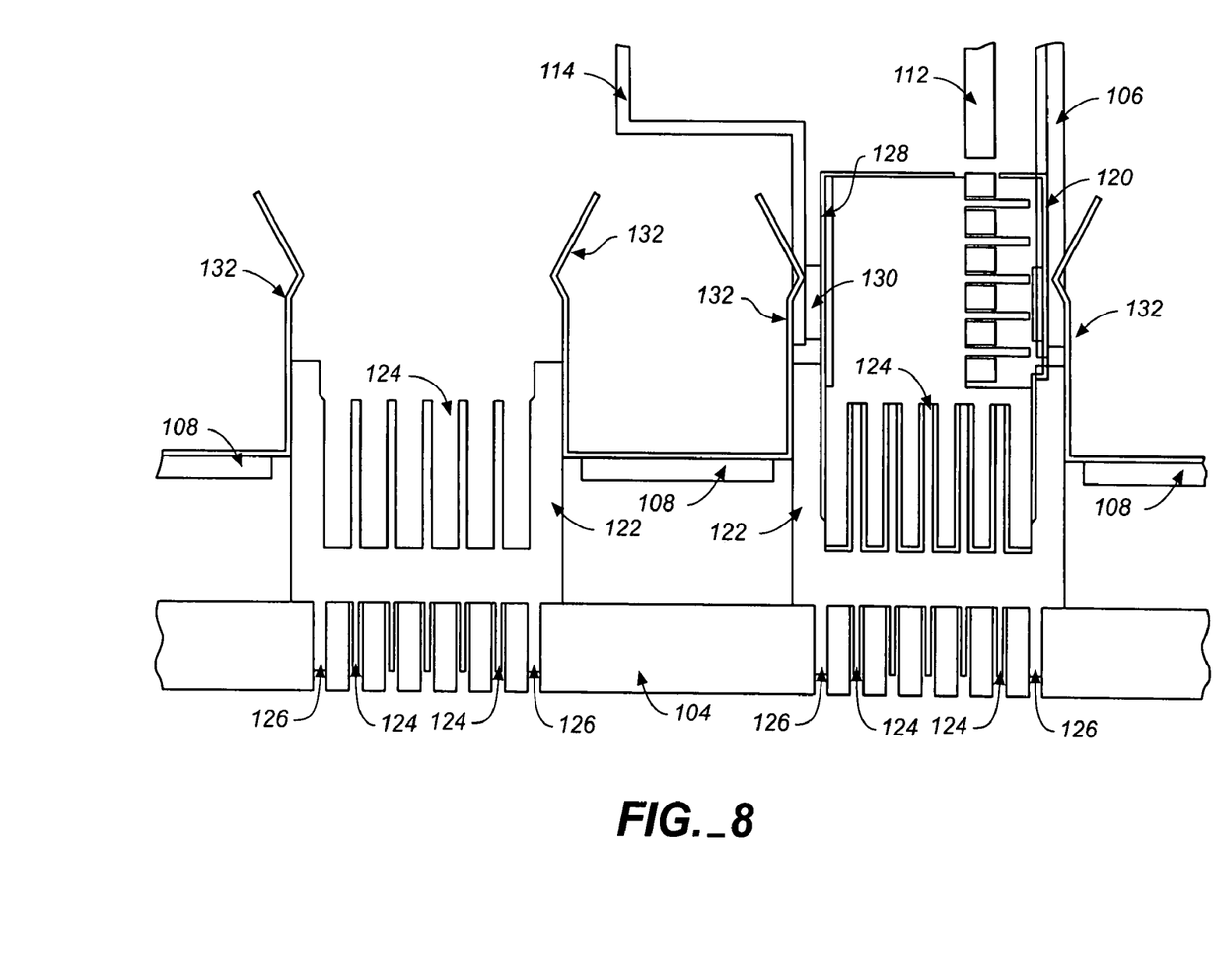
FIG. 8 is a partial top plan view illustrating interconnection of the interface module and the midplane circuit board of the system shown in FIG. 4.
Figure 9:
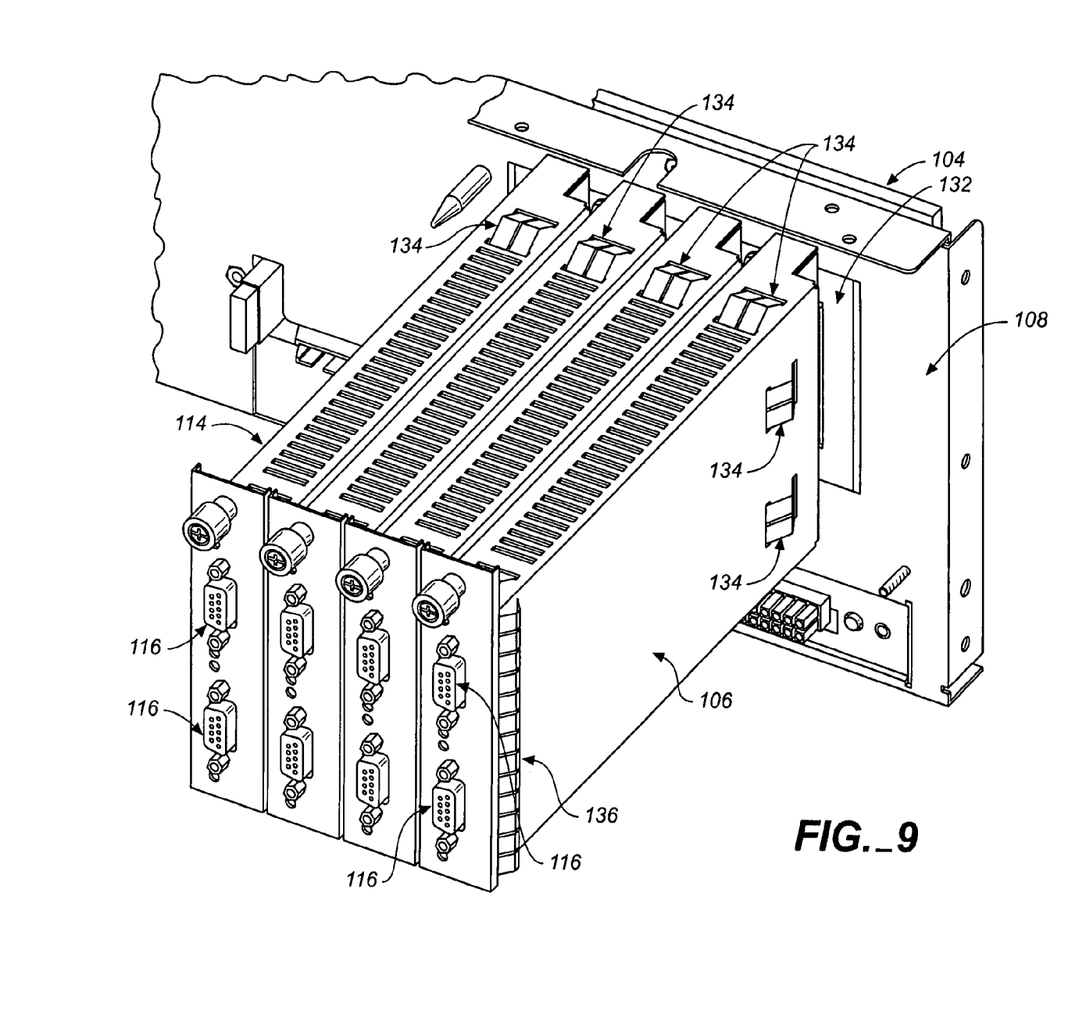
FIG. 9 is a partial isometric view illustrating the system shown in FIG. 4, wherein multiple interface devices are inserted in the interface module bay of the electronic device.
Figure 10:
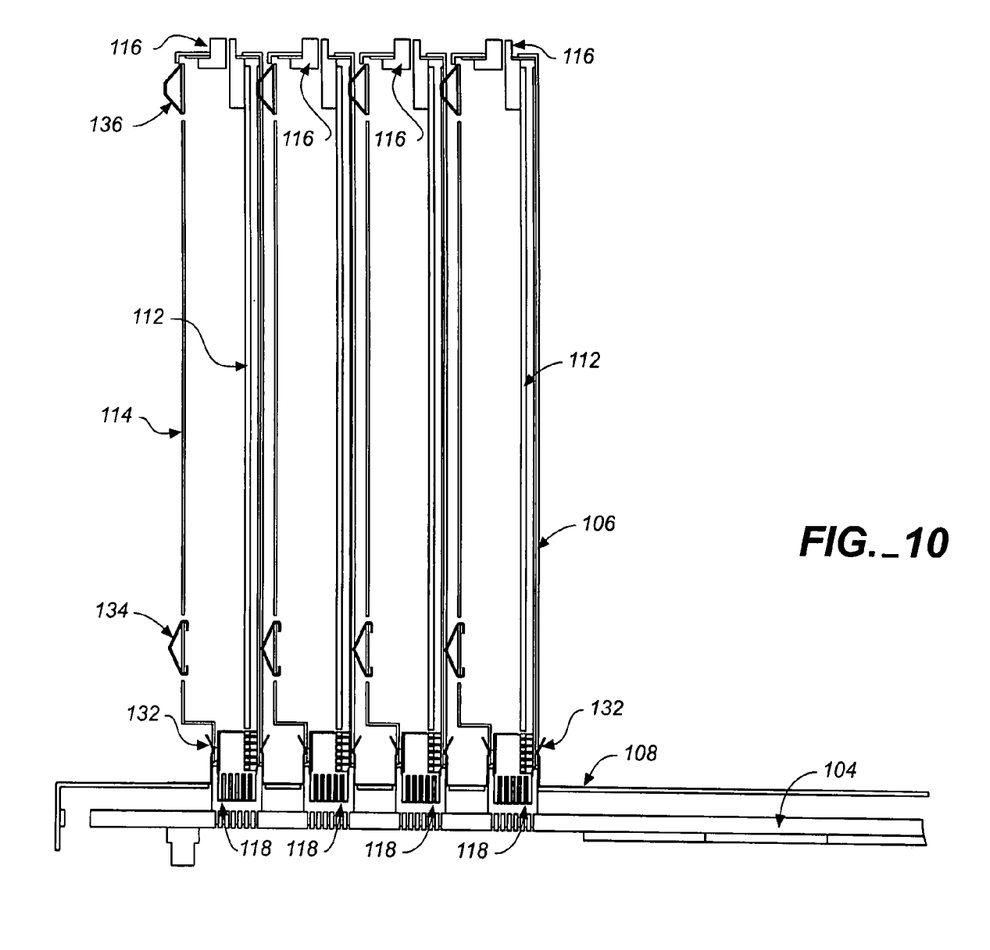
FIG. 10 is a partial top plan view of the system shown in FIG. 9.
Figure 11:
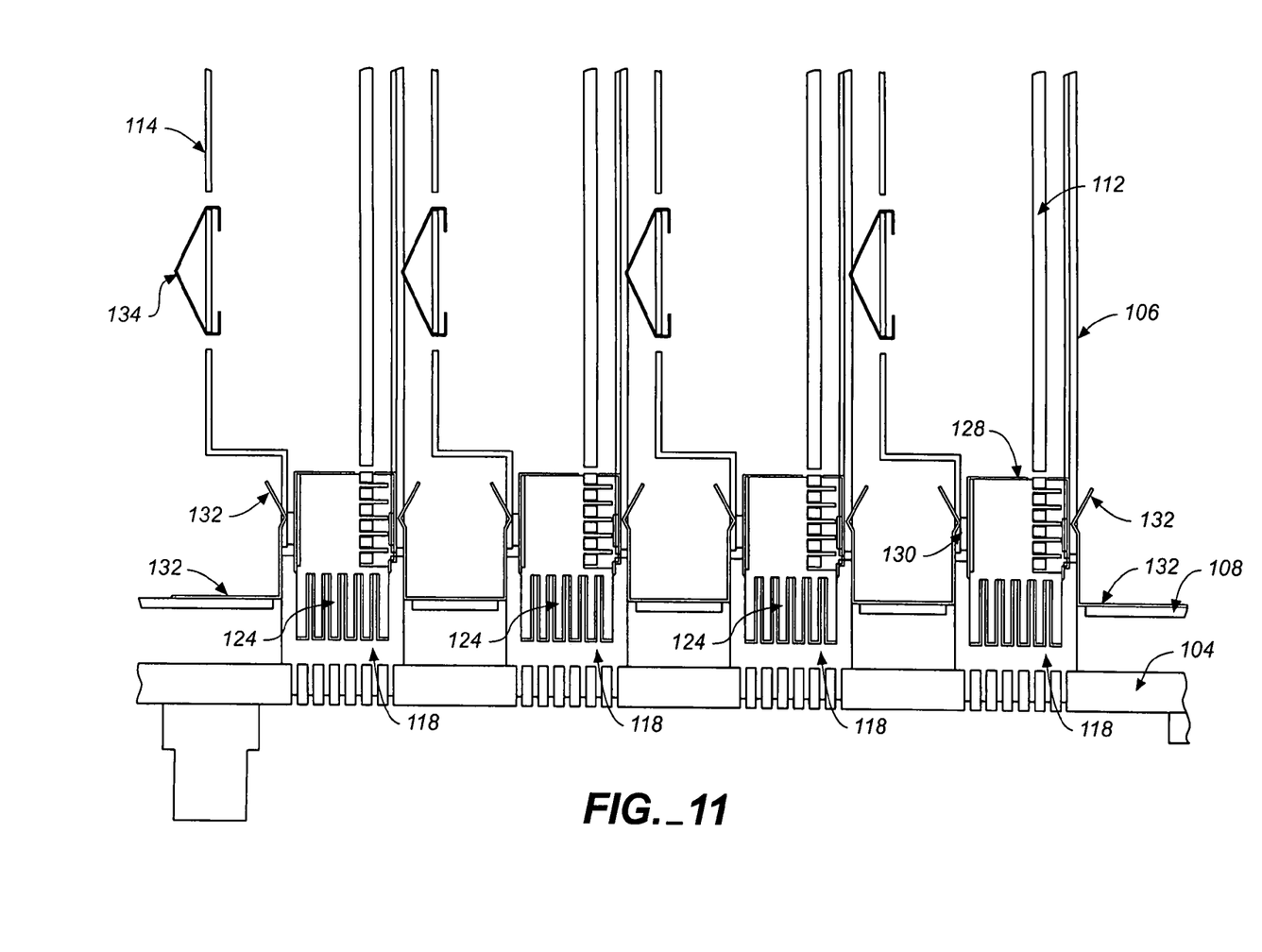
FIG. 11 is a partial top plan view illustrating interconnection of the interface module and the midplane circuit board of the system shown in FIG. 9.
Figure 12:
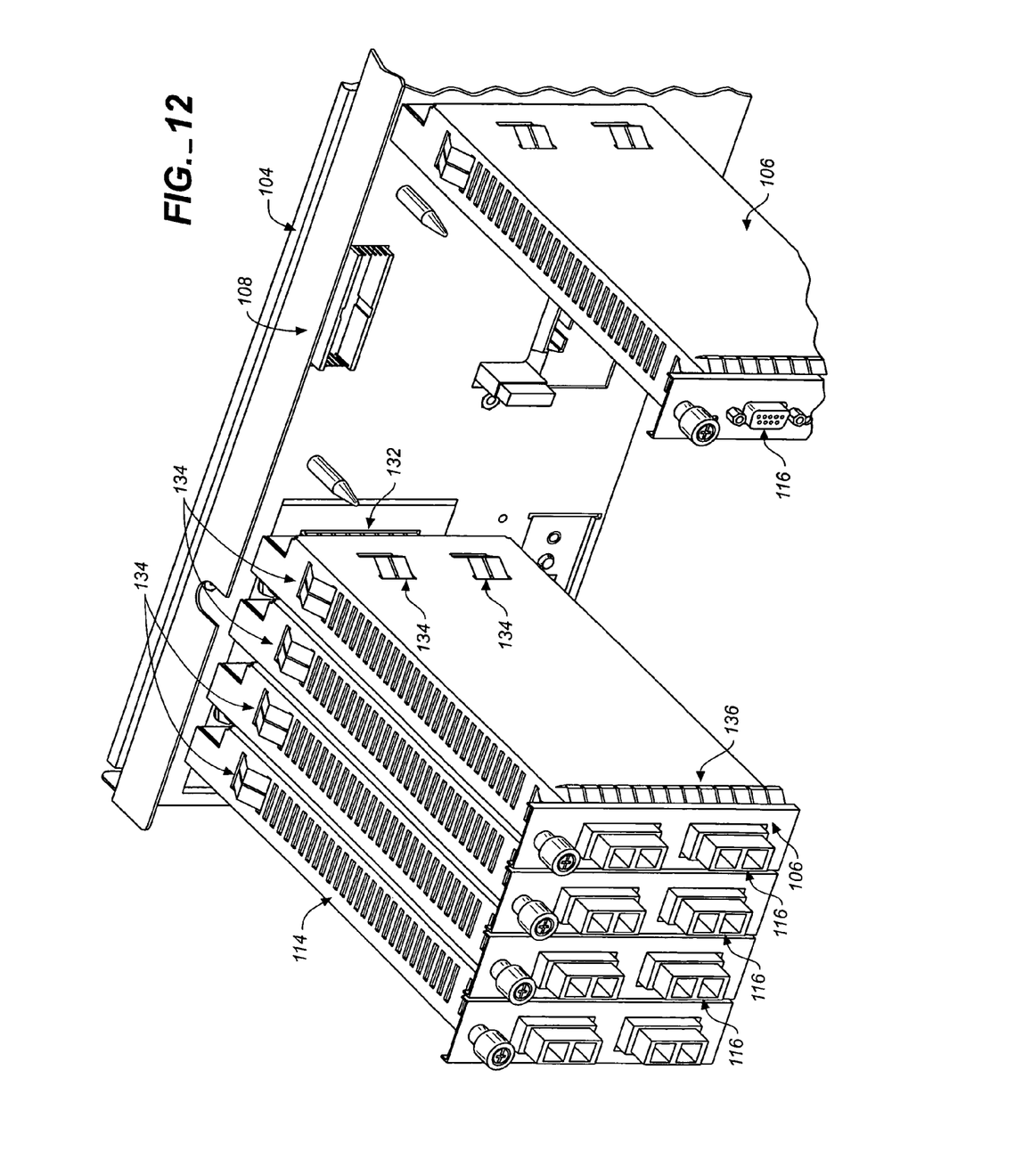
FIG. 12 is a partial isometric view illustrating the system shown in FIG. 4, wherein multiple interface devices are inserted in the interface module bay of the electronic device.

As shown in FIGS. 8 and 11, the first connector half 120 of each interface module 106 further comprises an interface connector shield 128. The interface connector shield 128 surrounds the first connector half 120 shielding the first connector half from the remainder of the interface module 106. A gasket 130 is disposed between the interface connector shield 128 and the interface module container 114. The interface connector shield 128 and gasket 130 cooperate with the midplane circuit board 104, midplane chassis shield 108 and interface module 106 to provide a low impedance tunnel for channeling high frequency signals to ground.

Referring again generally to FIGS. 1 through 12, interface modules 106 may be installed and removed from chassis 102 without disassembly of the interface module container 114. Preferably, the interface module containers 114 minimizes the use of fasteners such as screws, clips or like for securement in the chassis 102 (e.g., in FIGS. 1–12 modules utilizing a single thumbscrew are shown). In this manner, the modules 106 maintain their integrity when removed from the electronic device 100. Further, the interface modules 106 may be installed in and removed from the chassis 102 of the device 100 without requiring use of tools such as a screwdriver, wrench, or the like.

As shown in FIGS. 1 through 12, the midplane chassis shield 108 may further include guides 132 for aligning and securing the interface module 106 to the midplane chassis shield 108. Preferably, guides 132 also provide multiple grounds between the interface module container 114 and the midplane chassis shield 108 for grounding the interface module 106 to the shield 108 thereby redirecting and containing high frequency signals within the modules 106. In the exemplary embodiment shown, guides 132 are comprised of tabs or fingers formed of Beryllium Copper (BeCu), or, alternately, a spring steel or like resilient material. As shown, the guides 132 are disposed on each side of apertures 110 and positioned to engage and retain interface module container 114. However, it will be appreciated that use of other guide designs, such as a single piece guide or the like are also contemplated and thus would not depart from the scope and spirit of the invention.

The module container 114 of each interface module 106 may further include suspension grounding springs 134. In exemplary embodiments, suspension grounding springs 134 are comprised of tabs or fingers formed of Beryllium Copper (BeCu) and plated with Nickel (Ni). Alternately, these tabs may be formed of a spring steel or like resilient material. As shown, the suspension grounding springs 134 are mounted to the walls of the container 114 so as to extend away from the container 114 to engage the container 114 of an adjacent interface module 106 as shown in FIG. 11, or to engage the chassis 102 of the electronic device 100 for suspending or holding the interface module 106 in place. Preferably, suspension grounding springs 134 also ground the interface modules 106 to each other for containing high frequency signals within the modules 106. Similarly, each interface module 106 may further include an EMC seal 136 disposed adjacent to their outer end. In exemplary embodiments, EMC seal 136 is comprised of rows of tabs or fingers formed of Beryllium Copper (BeCu) and plated with Nickel (Ni), or alternately, of a spring steel or like resilient material. As shown, the EMC seals 136 are disposed on one side of interface module container 114 so as to extend away from the container 114 to engage the container 114 of an adjacent interface module 106 as shown in FIG. 11, or to engage the chassis 102 of the electronic device 100 for suspending or holding the interface module 106 in place. Like the suspension grounding springs 134, the EMC seal 136 provides a ground for grounding the interface modules 106 to each other for containing high frequency signals within the modules 106.

The present invention provides a common ground for EMC and RFI high frequency signals between the midplane circuit board 104, midplane chassis shield 108, interface circuit boards 112, and interface module containers 114 for providing a low impedance tunnel for channeling high frequency signals to ground. Thus, the high frequency energy is substantially contained around the interconnecting areas of midplane circuit board 104, midplane chassis shield 108, interface circuit boards 112, and interface module containers 114 and is not permitted to interfere with other components of the electronic device 100 and/or with components of other devices positioned near the electronic device 100. In this manner, the energy generated by high frequency interconnect technologies such as Fibre Channel and the like is contained until it reaches the external interface port 116.

It is believed that the system of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A system for channeling high frequency signals within an electronic device, comprising:
   a midplane circuit board;
   a midplane chassis shield disposed adjacent to said midplane circuit board;
   an interface module suitable for being coupled to said midplane circuit board through said midplane chassis shield, the interface module including an EMC seal, an interface module container and an interface circuit board, said interface circuit board being substantially contained within said interface module container;
   an interface connector suitable for coupling said interface circuit board to said midplane circuit board, said interface connector including a first connector half coupled to said interface circuit board and including an interface connector shield and a second connector half coupled to said midplane circuit board; and
   a gasket disposed between said interface connector shield and said interface module container;
   wherein said interface connector shield, midplane circuit board, midplane chassis shield and interface module cooperate for providing a low impedance tunnel for channeling high frequency signals to ground.

2. The system according to claim 1, wherein said connector further comprises at least one logic pin and at least one ground shield pin.

3. The system according to claim 1, wherein said interface module container further comprises at least one suspension ground spring suitable for substantially holding said interface module in said electronic device.

4. The system according to claim 1, wherein said midplane chassis shield comprises at least one guide for securing said interface module to said midplane chassis.

5. An electronic device, comprising:
   a housing;
   a midplane circuit board;
   a midplane chassis shield disposed adjacent to said midplane circuit board;
   an interface module suitable for being coupled to said midplane circuit board through said midplane chassis shield, the interface module including an EMC seal an interface module container and an interface circuit board, said interface circuit board being substantially contained within said interface module container;
   an interface connector suitable for coupling said interface circuit board to said midplane circuit board, said interface connector including a first connector half coupled to said interface circuit board and including an interface connector shield and a second connector half coupled to said midplane circuit board; and
   a gasket disposed between said interface connector shield and said interface module container;
   wherein said interface connector shield, midplane circuit board, midplane chassis shield and interface module cooperate for providing a low impedance tunnel for channeling high frequency signals to ground.

6. The electronic device according to claim 5, wherein said connector further comprises at least one logic pin and at least one ground shield pin.

7. The electronic device according to claim 5, wherein said interface module container further comprises at least one suspension ground spring suitable for substantially holding said interface module in said electronic device.

8. The electronic device according to claim 5, wherein said midplane chassis shield comprises at least one guide for securing said interface module to said midplane chassis.

* * * * *